United States Patent
Ikeda et al.

(10) Patent No.: US 9,042,165 B2
(45) Date of Patent: May 26, 2015

(54) MAGNETORESISTIVE EFFECT ELEMENT, MAGNETIC MEMORY CELL USING SAME, AND RANDOM ACCESS MEMORY

(75) Inventors: Shoji Ikeda, Sendai (JP); Hideo Ohno, Sendai (JP); Hiroyuki Yamamoto, Shiki (JP); Kenchi Ito, Kunitachi (JP); Hiromasa Takahashi, Hachioji (JP)

(73) Assignees: Hitachi, Ltd., Tokyo (JP); Tohoku University, Sendai-shi, Miyagi (JP)

( * ) Notice: Subject to any disclaimer, the term of this patent is extended or adjusted under 35 U.S.C. 154(b) by 375 days.

(21) Appl. No.: 13/575,387

(22) PCT Filed: Jan. 25, 2011

(86) PCT No.: PCT/JP2011/051264
§ 371 (c)(1),
(2), (4) Date: Oct. 5, 2012

(87) PCT Pub. No.: WO2011/093252
PCT Pub. Date: Aug. 4, 2011

(65) Prior Publication Data
US 2013/0028013 A1   Jan. 31, 2013

(30) Foreign Application Priority Data
Jan. 26, 2010 (JP) ................. 2010-014576

(51) Int. Cl.
| G11C 11/00 | (2006.01) |
| H01L 27/22 | (2006.01) |
| B82Y 25/00 | (2011.01) |
| H01F 10/32 | (2006.01) |
| H01L 43/08 | (2006.01) |
| H01F 10/16 | (2006.01) |
| H01F 10/12 | (2006.01) |

(52) U.S. Cl.
CPC ............ H01L 27/228 (2013.01); B82Y 25/00 (2013.01); *H01F 10/16* (2013.01); H01F 10/3254 (2013.01); H01L 43/08 (2013.01); H01F 10/3286 (2013.01); *H01F 10/123* (2013.01)

(58) Field of Classification Search
CPC ...... G11C 11/16; G11C 11/15; G11C 7/1075; H01L 43/08; H01L 27/224; H01L 27/228; H01L 27/22; H01L 43/10; H01L 27/226
USPC .................. 365/158, 171, 173, 148; 257/421, 257/E29.323
See application file for complete search history.

(56) References Cited

U.S. PATENT DOCUMENTS

| 2002/0105827 A1 | 8/2002 | Redon et al. |
| 2005/0041456 A1 | 2/2005 | Saito |

(Continued)

FOREIGN PATENT DOCUMENTS

| JP | 2002-305337 A | 10/2002 |
| JP | 2005-32878 A | 2/2005 |

(Continued)

*Primary Examiner* — Hien Nguyen
(74) *Attorney, Agent, or Firm* — Miles & Stockbridge P.C.

(57) ABSTRACT

A magnetoresistive effect element uses a perpendicularly magnetized material and has a high TMR ratio. Intermediate layers composed of an element metal having a melting point of 1600° C. or an alloy containing the metal on an outside of a structure consisting of a CoFeB layer, an MgO barrier layer, and a CoFeB layer. By inserting the intermediate layers, crystallization of the CoFeB layer during annealing is advanced from an MgO (001) crystal side, so that the CoFeB layer has a crystalline orientation in bcc (001).

8 Claims, 8 Drawing Sheets

(56) References Cited

U.S. PATENT DOCUMENTS

| | | |
|---|---|---|
| 2007/0086121 A1 | 4/2007 | Nagase et al. |
| 2007/0297220 A1 | 12/2007 | Yoshikawa et al. |
| 2009/0080238 A1 | 3/2009 | Yoshikawa et al. |

FOREIGN PATENT DOCUMENTS

| | | |
|---|---|---|
| JP | 2007-142364 A | 6/2007 |
| JP | 2008-028362 A | 2/2008 |
| JP | 2008-283173 A | 11/2008 |
| JP | 2009-81216 A | 4/2009 |
| JP | 2009-194398 A | 8/2009 |

# MAGNETORESISTIVE EFFECT ELEMENT, MAGNETIC MEMORY CELL USING SAME, AND RANDOM ACCESS MEMORY

TECHNICAL FIELD

The present invention relates to a magnetoresistive effect element using perpendicularly magnetized material, a magnetic memory cell using the same, and a random access memory.

BACKGROUND ART

In recent years, an MRAM (Magnetic Random Access Memory) has been developed as a memory using magnetic material. The MRAM uses an MTJ (Magnetic Tunneling Junction) utilizing a tunneling magnetoresistive (TMR) effect as a factor element. The MTJ element has a structure in which a non-magnetic material layer (insulating layer) is sandwiched between two ferromagnetic layers, which allows the magnetization direction of a ferromagnetic layer (recording layer) on one side to be reversed due to an external magnetic field. Thus, in the MTJ element, the magnetization direction of the magnetic material layer is controlled to thereby record information. Because the magnetization direction of the magnetic material does not change even when the power supply is turned off, a non-volatile operation for holding the recorded information can be achieved. To change the magnetization direction of the MTJ element (rewrite information), not only a method for applying a magnetic field from the outside, but also a spin transfer torque magnetization reversal (spin injection magnetization reversal) method for allowing a DC current to flow through an MTJ element to reverse the magnetization have recently been found. For example, Patent Literature 1 discloses an MTJ element which uses an in-plane magnetized material as a recording layer and utilizes the spin injection magnetization reversal, and also discloses a memory having the MTJ element integrated thereon, that is, an SPRAM (SPin-transfer torque Magnetic Random Access Memory).

To improve the integration of the SPRAM, it is necessary to miniaturize the MTJ element. In this case, the thermal stability of magnetic information in the MTJ element is a problem to be solved. When thermal energy generated by an ambient temperature is high with respect to magnetic energy necessary for allowing the recording layer of the MTJ element to be reversed, the magnetization is reversed even when no external magnetic field or current is applied. Because the magnetic energy of the MTJ element decreases along with a reduction in the size, the thermal stability decreases along with the miniaturization of the element. Even in a minute area, it is effective to increase the crystal magnetic anisotropy of the recording layer material of the MTJ element to maintain the thermal stability and achieve highly-reliable operation. Up to now, an MTJ element using a perpendicularly magnetized material having a higher crystal magnetic anisotropy than that of the in-plane magnetized material is disclosed (Patent Literature 2). Further, in the MTJ element using the perpendicularly magnetized material, a demagnetizing field applied in the recording layer affects the direction in which a current density (write current density) necessary for reversing the magnetization is reduced, unlike the in-plane magnetized MTJ element. Thus, there is an advantage of reducing the write current density and suppressing power consumption, compared with the in-plane magnetized MTJ element.

There is disclosed a structure in which magnesium oxide (MgO) is used for an insulating layer (barrier layer) as means for improving a resistance change ratio (TMR ratio) in the perpendicularly magnetized MTJ element, and material (CoFeB or the like) having high electron spin polarizability is disposed on both sides of the insulating layer (Patent Literature 3). Here, the perpendicularly magnetized ferromagnetic layer is disposed in direct contact with the high-polarizability magnetic layer. There is also proposed an element using a structure (synthetic ferri-magnetic structure) in which non-magnetic material layer is sandwiched by two perpendicularly magnetized layers as a perpendicularly magnetized layer (Patent Literature 3). In this case, magnetizations of two perpendicularly magnetized layers are coupled in an antiparallel direction, which provides the effect of suppressing a stray field generated from the perpendicularly magnetized layer.

To produce the perpendicularly magnetized MTJ element as described above and to obtain a higher TMR ratio, the crystalline orientation of each of the barrier layer and the high polarizability magnetic layer formed on both sides of the barrier layer is important. From the past study on the in-plane magnetized TMR element, it is known that a high TMR ratio is obtained when an MgO (001) barrier layer having an NaCl structure is used and a CoFeB layer having a bcc (001) crystal structure is disposed on both sides of the MgO (001) barrier layer. When CoFeB is formed at room temperature, the CoFeB is grown in an amorphous state. When MgO is further formed thereon, MgO (001) crystal is grown. When an anneal treatment is carried out after CoFeB is further formed thereon, the CoFeB layer has a crystalline orientation in bcc (001) with the MgO (001) crystal as a core. In the case of the in-plane magnetized TMR element, the bcc (001) orientation of MgO (001) and CoFeB are realized using such a mechanism.

CITATION LIST

Patent Literature

[Patent Literature 1] JP 2002-305337 A
[Patent Literature 2] JP 2005-32878 A
[Patent Literature 3] JP 2007-142364 A

SUMMARY OF INVENTION

Technical Problem

In the case of applying a combination of CoFeB and MgO to a perpendicularly magnetized MTJ element, it is necessary to taken into consideration the material adjacent to CoFeB. As described above, annealing after the formation of the thin-film is essential to realize the bcc (001) crystalline orientation of CoFeB so as to obtain a high TMR ratio. However, even when the CoFeB/MgO/CoFeB laminate structure is formed, the bcc (001) orientation of the CoFeB layer may not be obtained after the annealing, depending on the material adjacent to the outside of CoFeB. This is because the crystallization of CoFeB is advanced not from an MgO interface but from the material formed on the opposite side. To realize the bcc (001) crystalline orientation of MgO (001) and CoFeB, it is necessary to select an appropriate material that does not interfere with the crystallization from the MgO side of CoFeB, as the material adjacent to CoFeB. In the conventional perpendicular TMR element structure, CoFeB and the perpendicularly magnetized magnetic layer are in direct contact with each other, which makes it difficult to realize the bcc (001) structure of CoFeB by an anneal treatment after the formation of the thin-film, depending on the material to be used for the perpendicularly magnetized magnetic layer. Accordingly, in the case of applying a technique similar to the in-plane magnetized MTJ element (crystallizing CoFeB by increasing the anneal temperature to thereby obtain a high TMR ratio), there is a problem that the TMR ratio decreases along an increase in the anneal temperature, or the TMR ratio improves until a certain temperature but decreases at a higher temperature to the contrary.

In view of the above-mentioned problem, the present invention provides a perpendicularly magnetized MTJ element showing a high TMR ratio even after an anneal treatment.

Solution to Problem

A magnetoresistive effect element (MTJ element) of the present invention is an MTJ element which uses a perpendicularly magnetized material and has a structure in which a CoFeB layer serving as a ferromagnetic layer having high polarizability is disposed on a substrate side or both sides of an MgO barrier layer. Further, a perpendicularly magnetized magnetic layer is disposed at an interface of the high polarizability magnetic layer on an opposite side to the barrier layer through an intermediate layer including a metal having a melting point of 1600° or higher or an alloy containing the metal interposed.

Advantageous Effects of Invention

According to the present invention, it is possible to produce a perpendicularly magnetized MTJ element showing a high TMR ratio after annealing.

DESCRIPTION OF EMBODIMENTS

An embodiment of the present invention will be described in detail with reference to the drawings.

Example 1

Figure 1:
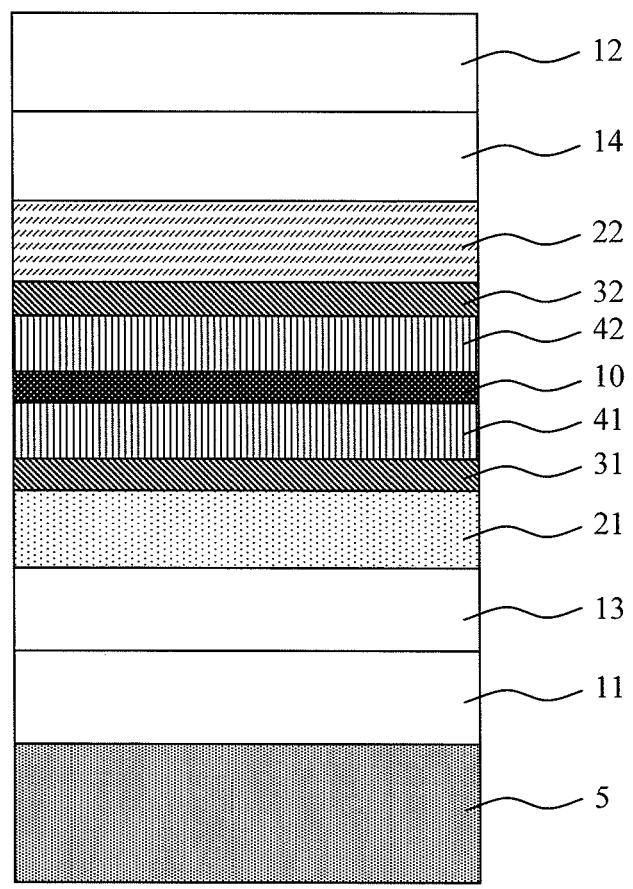
FIG. 1 is a sectional schematic diagram of an MTJ element of Example 1.

FIG. 1 shows a cross-sectional schematic diagram of an MTJ element according to Example 1. A first high polarizability magnetic layer 41 and a second high polarizability magnetic layer 42, which have a high electron spin polarizability, are disposed on both sides of a barrier layer 10. On the outside thereof, a first intermediate layer 31 and a second intermediate layer 32 are disposed, and a first magnetic layer 21 and a second magnetic layer 22 are disposed to be respectively adjacent to these layers. Further, on the lower side of the first magnetic layer 21, a lower electrode 11 and a foundation layer 13 are formed, and on the upper side of the second magnetic layer 22, a cap layer 14 and an upper electrode 12 are formed.

As materials of each layer, MgO (film thickness: 1 nm) was used as the barrier layer 10; a multi-layer film (film thickness: 14 nm) formed by laminating a two-layer film of CoFe (film thickness: 0.2 nm) and Pd (film thickness: 1.2 nm) by 10 cycles was used as the first magnetic layer 21; and a multi-layer film (film thickness: 4.2 nm) formed by laminating a two-layer film of CoFe (film thickness: 0.2 nm) and Pd (film thickness: 1.2 nm) by three cycles was used as the second magnetic layer 22. Further, CoFeB (film thickness: 1 nm) was applied as each of the first high polarizability magnetic layer 41 and the second high polarizability magnetic layer 42, and Ta (film thickness: 0.5 nm) was used as each of the first intermediate layer 31 and the second intermediate layer 32. A Ta layer (film thickness: 5 nm) was used as the lower electrode 11, and Ru (film thickness: 10 nm) was used as the foundation layer 13. A thin film formed by laminating Ta (film thickness: 5 nm) and Ru (film thickness: 5 nm) in this order was used as the cap layer 14. Each layer was formed on an Si substrate 5 by an RF sputtering method using Ar gas.

After the formation of the laminated film, the resultant was processed into a pillar shape having an upper surface area of 50×50 nm by using electron beam (EB) lithography and ion beam etching. After that, the upper electrode 12 composed of a laminate structure of Cr (film thickness: 5 nm)/Au (film thickness: 100 nm) was formed. Though not illustrated, the upper electrode layer 12 and the lower electrode layer 11 are each connected to a wire for allowing a current to flow through the element.

Operation of the element will be described with reference to FIGS. 2A to 2C. To facilitate the explanation, only the barrier layer 10, the first magnetic layer 21, the second magnetic layer 22, the first high polarizability magnetic layer 41, the second high polarizability magnetic layer 42, the first intermediate layer 31, and the second intermediate layer 32, which are associated with a change in resistance of the element, are illustrated. When a current is caused to flow the element perpendicularly to the film surface of the element, the magnetization of the second magnetic layer 22, which has a smaller thickness than the first magnetic layer 21, is reversed first. Accordingly, the laminated magnetic layer (second high polarizability magnetic layer 42/second intermediate layer 32/second magnetic layer 22) formed on the upper side of the barrier layer 10 serves as a recording layer, and the laminated magnetic layer (first magnetic layer 21/first intermediate layer 31/first high polarizability magnetic layer 41) formed on the lower side serves as a pinned layer.

Figure 2A:
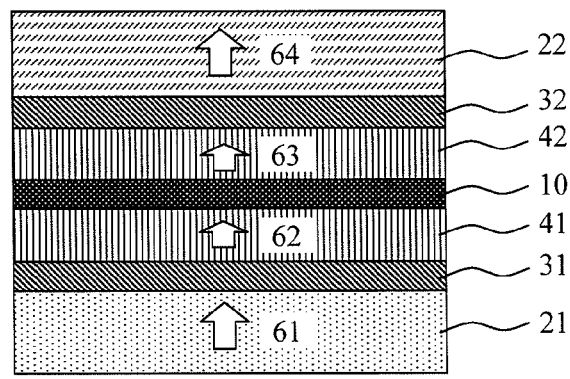
FIG. 2A is a diagram schematically showing a magnetization reversal operation of an MTJ of Example 1.

FIG. 2A shows an initial state in which no current flows through the element. Magnetization 61 of the first magnetic layer 21, magnetization 62 of the first high polarizability magnetic layer 41, magnetization 64 of the second magnetic layer 22, and magnetization 63 of the second high polarizability magnetic layer 42 face upward. The first high polarizability magnetic layer 41 is ferromagnetically coupled with the first magnetic layer 21, so that the magnetizations of the both layers are linked and oriented in the same direction. The same holds true of the magnetizations of the second high polarizability magnetic layer 42 and the second magnetic layer 22.

Figure 2B:
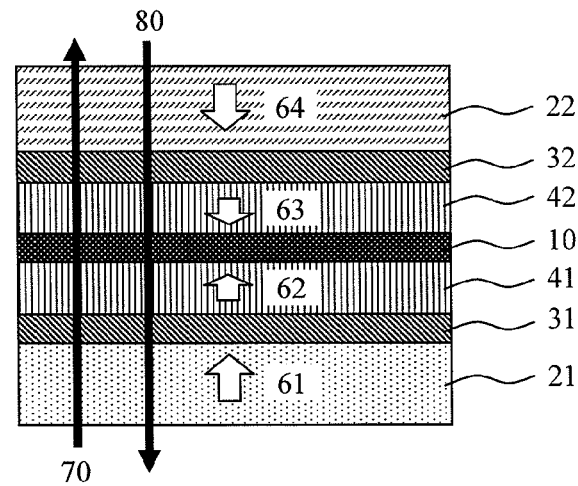
FIG. 2B is a diagram schematically showing a magnetization reversal operation of the MTJ element of Example 1.

FIG. 2B shows a direction of magnetization obtained when a current is caused to flow through the element from the state of FIG. 2A. When a current 70 is caused to flow to the upper side from the lower side of the element, a spin-polarized electron 80 passes through the second high polarizability magnetic layer 42 and flows to the first high polarizability magnetic layer 41. In this case, only electrons having a spin in the same direction as that of the second high polarizability magnetic layer 42 flow into the first high polarizability magnetic layer 41, and electros having a spin in the opposite direction are reflected by the surface of the barrier layer 10. The reflected electrons act on the magnetization 63 of the second high polarizability magnetic layer 42 of the recording layer, and the magnetization 63 of the second high polarizability magnetic layer 42 is reversed by spin injection magnetization reversal. At the same time, the magnetization 64 of the second magnetic layer 22, which is coupled with the second high polarizability magnetic layer 42, is also reversed. At this time, the magnetization 62 of the first high polarizability magnetic layer 41 of the pinned layer and the magnetization 63 of the second high polarizability magnetic layer 42 of the recording layer are aligned in antiparallel with each other, and the MTJ element is switched from a low-resistance state to a high-resistance state.

Figure 2C:
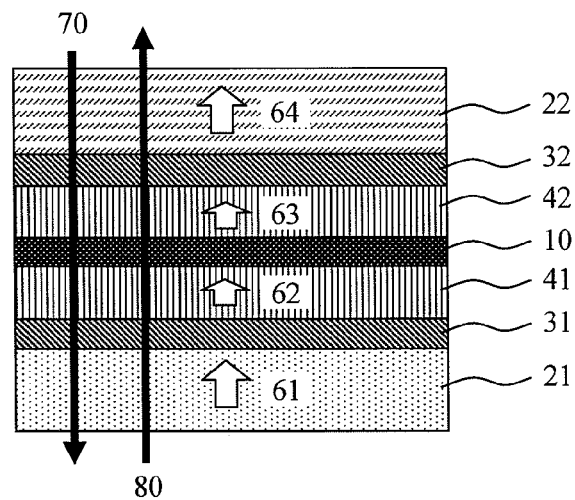
FIG. 2C is a diagram schematically showing a magnetization reversal operation of the MTJ element of Example 1.

On the other hand, when a current is caused to flow from the upper portion of the element to the lower portion, the state of FIG. 2B shifts to a state shown in FIG. 2C. When the current 70 is caused to flow from the upper portion to the lower portion of the element, the spin-polarized electron 80 flows from the first high polarizability magnetic layer 41 into the second high polarizability magnetic layer 42, and the magnetization 63 of the second high polarizability magnetic layer 42 is reversed by spin injection magnetization reversal. At the same time, the magnetization 64 of the second magnetic layer 22, which is magnetically coupled with the second high polarizability magnetic layer 42, is also reversed. At this time, the magnetization 62 of the first high polarizability magnetic layer 41 of the pinned layer and the magnetization 63 of the second high polarizability magnetic layer 42 of the recording layer are aligned in parallel with each other, and the resistance of the MTJ element switches from the high-resistance state to the low-resistance state.

Figure 3:
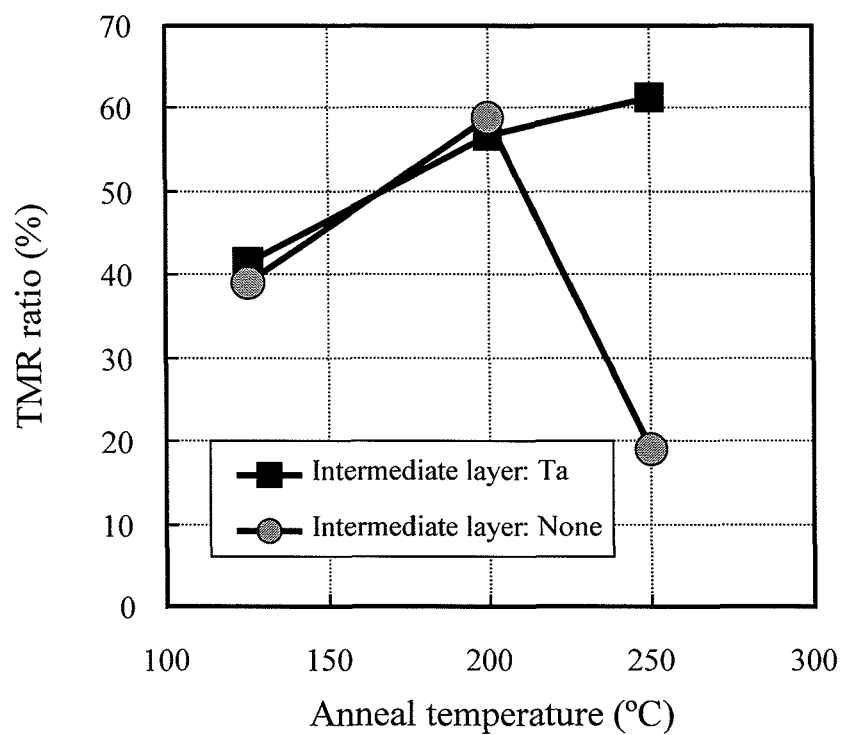
FIG. 3 is a diagram showing a dependency of a TMR ratio on an anneal temperature regarding the MTJ element of Example 1.

FIG. 3 shows evaluation results of the produced element having the structure of Example 1. The TMR ratio increased along with the anneal temperature, and a TMR ratio of 60% was obtained after annealing at 250° C. On the other hand, as a comparison, in the case of an element (having a structure in which CoFeB of the first high polarizability material 41 contacts Pd formed on the uppermost portion of the first magnetic layer 21) produced without inserting the first intermediate layer 31 and the second intermediate layer 22, the same TMR ratio as that of the element of Example 1 was shown until the anneal temperature of 200° C., but the TMR ratio decreased to 20% after annealing at 250° C. That is, the effect of improving the heat resistance of the TMR ratio by inserting an appropriate intermediate layer (Ta) in the element having the structure of Example 1 was confirmed. As described above, when Pd having a melting point of lower than 1600° C. or lower contacts CoFeB as the intermediate layer, the heat resistance of the TMR ratio deteriorates. In addition, also when Al or the like having a melting point of lower than 1600° C. was applied, the same results as those for Pd were obtained.

The reason that the heat resistance of the TMR ratio improves in the element of Example 1 is as follows. That is, when CoFeB is subjected to heat treatment, boron (B) diffusion occurs. In this case, when the appropriate intermediate layer is adjacent to CoFeB as in Example 1, the boron diffusion is suppressed, and CoFeB is crystallized from the interface of the MgO (001) crystal and oriented in bcc (001). On the other hand, when there is no intermediate layer (when the magnetic layer is in direct contact), or when the intermediate layer is made of material (Pd, Cu, Al, or the like) which hardly suppresses the boron diffusion, boron contained in CoFeB is released by the diffusion in the process of annealing, CoFeB is crystallized into CoFe at a low anneal temperature. At that time, the crystallization of CoFeB advances from an opposite side of MgO (the side of the intermediate layer adjacent to CoFeB, or the magnetic layer side), and is crystallized with a crystal structure (fcc structure) different from bcc (001) or a different crystalline orientation (bcc (110)) due to the effect of the crystal structure of the intermediate layer or the magnetic layer. Accordingly, the insertion of the non-magnetic material that suppresses the boron diffusion is effective to obtain the bcc (001) crystal of CoFeB. Ta used for the intermediate layer in this example has a melting point (1600° C. or higher) higher than that of Co and Fe. In this case, the effect of allowing the crystallization of CoFeB to advance from the MgO side is obtained as described above. On the other hand, the melting point of Pd contacting CoFeB in the element in which the TMR ratio is deteriorated at the anneal temperature of 250° C. is 1600° C. or lower, which makes it difficult to allow the crystallization of CoFeB to advance from the MgO side.

Though Ta was used for the first intermediate layer 31 and the second intermediate layer 32 in Example 1, the same effect as that of Example 1 can be obtained also by using material having a melting point of 1600° C. or higher, such as W, Ru, Pt, Ti, Os, V, Cr, Nb, Mo, Rh, Hf, or Re. Alternatively, different combinations of the materials may also be used for the first intermediate layer 31 and the second intermediate layer 32.

Though a laminated film of CoFe and Pd was applied as the perpendicularly magnetized material of each of the first magnetic layer 21 and the second magnetic layer 22 in Example 1, the same effect as that of Example 1 can be obtained also by applying the other perpendicularly magnetized materials. Examples of specific materials to be used may include an $L1_0$ type ordered alloy, such as $Co_{50}Pt_{50}$, $Fe_{50}Pt_{50}$, or $Fe_{30}Ni_{20}Pt_{50}$, m-$D0_{19}$ type $Co_{75}Pt_{25}$ ordered alloy, material having a granular structure in which granular magnetic material such as CoCrPt-$SiO_2$ or FePt-$SiO_2$ is dispersed in a parent phase of non-magnetic material, a laminated film formed by alternately laminating any one of Fe, Co, and Ni or an alloy containing at least one of Fe, Co, and Ni, and non-magnetic metal such as Ru, Pt, Rh, Pd, or Cr, and an amorphous alloy, such as TbFeCo or GdFeCo, which contains a transition metal in a rare-earth metal such as Gd, Dy, or Tb. Alternatively, a CoCr alloy or a CoCrPt alloy which contains Co and at least one of Cr, Ta, Nb, V, W, Hf, Ti, Zr, Pt, Pd, Fe, and Ni may also be used, for example. Further, different combinations of the materials may also be used for the first magnetic layer 21 and the second magnetic layer 22.

It is desirable to use Ru or Ta, which is used in Example 1, as the cap layer 14, in view of the reaction or diffusion with the magnetic layer by the anneal treatment. In this case, however, metal such as Pt, Cr, Ti, or W may also be used as other materials.

In Example 1, the magnetic layer (second magnetic layer 22) formed on the upper side of the barrier layer 10 has a thickness smaller than that of the magnetic layer (first magnetic layer 21) on the lower side, so that the magnetization of the second magnetic layer 22 is reversed as the recording layer. On the contrary, also when the magnetic layer (first magnetic layer 21) formed on the lower side of the barrier layer 10 is set to have a thickness smaller than that of the magnetic layer (second magnetic layer 22) on the upper side, the same resistance change and the same TMR ratio as those of Example 1 are obtained. However, since the magnetic layer (first magnetic layer 21) formed on the lower side of the barrier layer 10 acts as the recording layer, the magnetization of the first magnetic layer 21 is reversed.

Example 2

Figure 4:
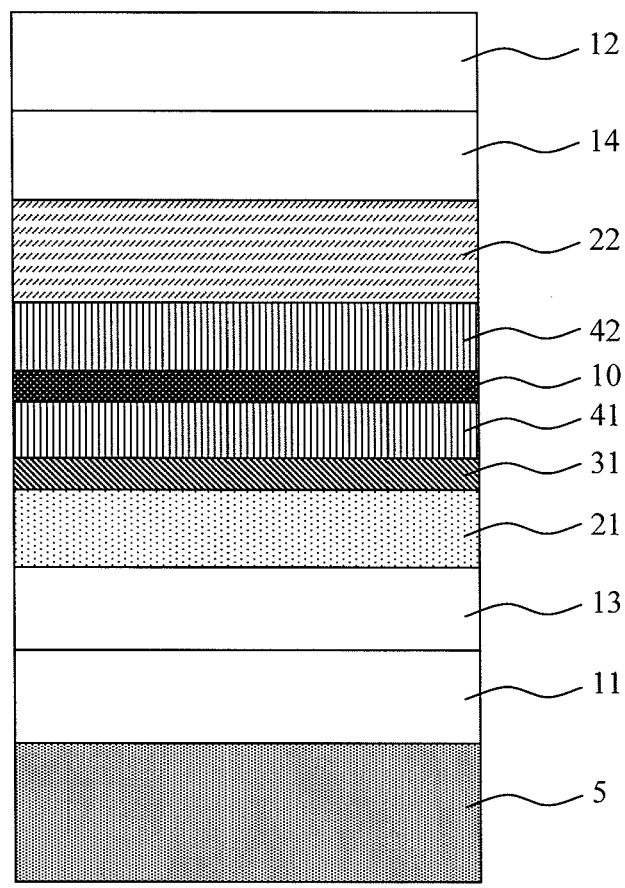
FIG. 4 is a cross-sectional schematic diagram of an MTJ element of Example 2.

Example 2 proposes an MTJ element in which a laminate structure of a perpendicularly magnetized magnetic layer, an intermediate layer, and a high polarization magnetic layer is applied only to the lower side of the barrier layer 10. FIG. 4 shows a cross-sectional schematic diagram of the MTJ element of Example 2. The basic structure is similar to that of the element illustrated in Example 1. However, in Example 2, the second magnetic layer 22 showing perpendicular magnetization is connected in direct contact with the second high polarizability magnetic layer 42, and no intermediate layer is inserted therebetween.

As materials of each layer, MgO (film thickness: 1 nm) was used for the barrier layer 10; a multi-layer film (film thickness: 14 nm) formed by laminating a two-layer film of CoFe (film thickness: 0.2 nm) and Pd (film thickness: 1.2 nm) by 10 cycles was used for the first magnetic layer 21; and a multi-layer film (film thickness: 4.2 nm) formed by laminating a two-layer film of CoFe (film thickness: 0.2 nm) and Pd (film thickness: 1.2 nm) by three cycles was used for the second magnetic layer 22. Further, CoFeB (film thickness: 1 nm) was applied as each of the first high polarizability magnetic layer 41 and the second high polarizability magnetic layer 42, and Ta (film thickness: 0.5 nm) was used for the first intermediate layer 31. A Ta layer (film thickness: 5 nm) was used for the lower electrode 11, and Ru (film thickness: 10 nm) was used for the foundation layer 13. A thin film formed by laminating Ta (film thickness: 5 nm) and Ru (film thickness: 5 nm) in this order was used for the cap layer 14.

Each layer was formed on the Si substrate 5 by the RF sputtering method using Ar gas. After sequentially laminating the layers in the range from the substrate 5 to the second high polarizability magnetic layer 42, in-situ annealing was carried out at 250° C. within a vacuum chamber at the stage. Thus, the MgO (001) crystalline orientation and the bcc (001) crystalline orientation of CoFeB are realized. After that, the layers in the range from the second magnetic layer 22 to the cap layer 14 were formed.

After the formation of the laminated film, the resultant was processed into a pillar shape having an upper surface area of 50×50 nm by using electron beam (EB) lithography and ion beam etching. After that, the upper electrode 12 having a laminate structure of Cr (film thickness: 5 nm)/Au (film thickness: 100 nm) was formed. Though not illustrated, each of the upper electrode layer 12 and the lower electrode layer 11 is connected with a wire for allowing a current to flow through the element.

The operation of the element is similar to that of Example 1. In Example 2, the second high polarizability magnetic layer 42 and the second magnetic layer 22 are ferromagnetically coupled and the magnetizations of the both layers are linked and oriented in the same direction, so that the same operation as that shown in FIGS. 2A to 2C of Example 1 is shown.

Evaluation results of the produced element having the structure of Example 2 showed that a TMR ratio of 60% was obtained in (as-depo) state in which no anneal treatment was carried out after the production of the element, and the TMR ratio was not lowered even when the anneal treatment was carried out at 250° C. after the production of the element. This is because the bcc (001) crystalline orientation of CoFeB and the MgO (001) crystalline orientation are realized at the stage of in-situ annealing during the formation of the thin-film. On the other hand, as a comparison, in the case of an element produced (a structure in which CoFeB of the first high polarizability material 41 contacts Pd formed on the uppermost portion of the first magnetic layer 21) without inserting the first intermediate layer 31, the TMR ratio was lower than that of Example 2 under the annealing condition at the temperature in the range of as-depo to lower than 250° C., and the TMR ratio was lowered to 20% after annealing at 250° C. In the manner as described above, the effect of improving the heat resistance of the TMR ratio by inserting the appropriate intermediate layer (Ta) was confirmed in the element having the structure of Example 2.

Further, in Example 2, immediately after the formation for the second high polarizability magnetic layer 42, in-situ annealing is carried out. Since no contact layer is formed on the upper portion of the second high polarizability magnetic layer 42, the second high polarizability magnetic layer 42 is affected only by MgO (001) and crystallized. That is, as for the second high polarizability magnetic layer 42, there is an advantage in that the bcc (001) structure can be easily realized without being affected by the material of the upper layer.

Though Ta was used for the first intermediate layer 31 in Example 2, the same effect as that of Example 2 can be obtained also by using material having a melting point of 1600° C. or higher, such as W, Ru, Pt, Ti, Os, V, Cr, Nb, Mo, Rh, Hf, or Re. Alternatively, different combinations of the materials may also be used for the first intermediate layer 31 and the second intermediate layer 32.

Though CoFeB was used as magnetic material of second high polarizability magnetic layer 42 in Example 2, other materials having a bcc crystal structure, such as $Co_{50}Fe_{50}$ or Fe, may also be used. For example, an amorphous CoFeB film is formed as the first high polarizability magnetic layer 41, and an MgO barrier layer 10 is oriented in a (001) direction and grown thereon. When Fe is deposited thereon as the second high polarizability magnetic layer 42, the bcc (001) structure of Fe grows along with the crystal structure of MgO, so that bcc-CoFeB (001)/MgO (001)/bcc-Fe (001) can be produced by an in-situ anneal treatment.

Though a laminated film of CoFe and Pd was applied as the perpendicularly magnetized material of each of the first magnetic layer 21 and the second magnetic layer 22 in Example 2, the same effect as that of Example 2 can also be obtained by applying the other perpendicularly magnetized material. Examples of specific materials to be used may include an $L1_0$ type ordered alloy, such as $Co_{50}Pt_{50}$, $Fe_{50}Pt_{50}$, or $Fe_{30}Ni_{20}Pt_{50}$, an m-$D0_{19}$ type $Co_{75}Pt_{25}$ ordered alloy, material having a granular structure in which granular magnetic material such as $CoCrPt-SiO_2$ or $FePt-SiO_2$ is dispersed in a parent phase of non-magnetic material, a laminated film formed by alternately laminating any one of Fe, Co, and Ni or an alloy containing at least one of Fe, Co, and Ni, and non-magnetic metal such as Ru, Pt, Rh, Pd, or Cr, and an amorphous alloy, such as TbFeCo or GdFeCo, which contains a transition metal in a rare-earth metal such as Gd, Dy, or Tb. Alternatively, a CoCr alloy or a CoCrPt alloy which contains Co and at least one of Cr, Ta, Nb, V, W, Hf, Ti, Zr, Pt, Pd, Fe, and Ni may also be used, for example. More alternatively, different combinations of the materials may also be used for the first magnetic layer 21 and the second magnetic layer 22.

It is desirable to use Ru or Ta, which is used in Example 2, as the cap layer 14, in view of the reaction or diffusion with the magnetic layer by the anneal treatment. In this case, however, metal such as Pt, Cr, Ti, or W may also be used as other materials.

Example 3

Figure 5:
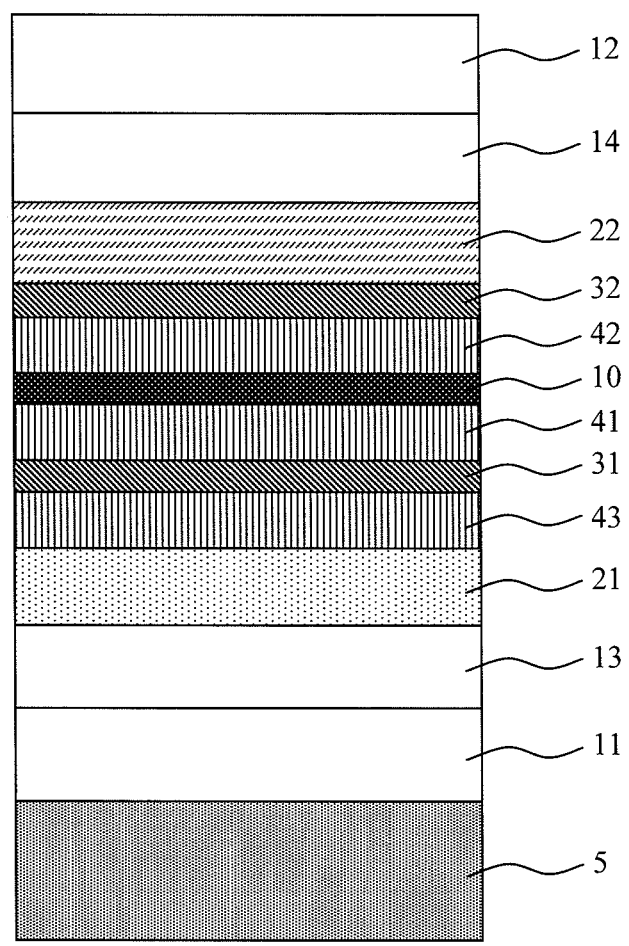
FIG. 5 is a cross-sectional schematic diagram of an MTJ element of Example 3.

Example 3 proposes an MTJ element in which a laminate structure of a perpendicularly magnetized magnetic layer, a high polarizability magnetic layer, an intermediate layer, and a high polarizability magnetic layer is applied to the lower side of the barrier layer. FIG. 5 shows a cross-sectional schematic diagram of the MTJ element of Example 3. The basic structure is similar to that of the element illustrated in Example 1, except that a third high polarizability magnetic layer 43 is inserted between the first intermediate layer 31 and the first magnetic layer 21.

As materials of each layer, MgO (film thickness: 1 nm) was used for the barrier layer 10; a multi-layer film (film thickness: 14 nm) formed by laminating a two-layer film of CoFe (film thickness: 0.2 nm) and Pd (film thickness: 1.2 nm) by 10 cycles was used for the first magnetic layer 21; and a multi-layer film (film thickness: 4.2 nm) formed by laminating a two-layer film of CoFe (film thickness: 0.2 nm) and Pd (film thickness: 1.2 nm) by three cycles was used for the second magnetic layer 22. Further, CoFeB (film thickness: 1 nm) was applied as each of the first high polarizability magnetic layer 41, the second high polarizability magnetic layer 42, and the third high polarizability layer 43, and Ta (film thickness: 0.5 nm) was used for the first intermediate layer 31. A Ta layer (film thickness: 5 nm) was used for the lower electrode 11 and Ru (film thickness: 10 nm) was used for the foundation layer 13. A thin film formed by laminating Ta (film thickness: 5 nm) and Ru (film thickness: 5 nm) in this order was used for the cap layer 14.

In the thin-film laminate structure of Example 3, a high polarizability magnetic layer of CoFeB is inserted above and below the intermediate layer 31. In this structure, CoFeB in an amorphous state after the thin-film formation alleviates the surface roughness of the first magnetic layer 21, thereby improving the surface flatness of the foundation layer of the MgO barrier layer. As a result, a more uniform barrier layer is obtained, which is effective for the improvement in TMR ratio and suppression in variation of the element characteristics.

The MTJ element of Example 3 was produced in the same method as that of Example 1 and the characteristics thereof were evaluated. As a result, the same operation as that of Example 1 was shown, and the same effect as that of Example 1 was obtained also for the dependency of the TMR ratio on the anneal temperature.

Though Ta was used for the first intermediate layer 31 and the second magnetic layer 32 in Example 3, the same effect as that of Example 3 can be obtained also by using material having a melting point or 1600° C. or higher, such as W, Ru, Pt, Ti, Os, V, Cr, Nb, Mo, Rh, Hf, or Re. Alternatively, different combinations of the materials may also be used for the first intermediate layer 31 and the second intermediate layer 32.

Though a laminated film of CoFe and PD was applied as the perpendicularly magnetized material of each of the first magnetic layer 21 and the second magnetic layer 22 in Example 3, the same effect as that of Example 3 can be obtained also by applying the other perpendicularly magnetized materials. Examples of specific materials to be used may include an $L1_0$ type ordered alloy, such as $Co_{50}Pt_{50}$, $Fe_{50}Pt_{50}$, or $Fe_{30}Ni_{20}Pt_{50}$, m-$D0_{19}$ type $Co_{75}Pt_{25}$ ordered alloy, material having a granular structure in which granular magnetic material such as $CoCrPt$-$SiO_2$ or $FePt$-$SiO_2$ is dispersed in a parent phase of non-magnetic material, a laminated film formed by alternately laminating any one of Fe, Co, and Ni or an alloy containing at least one of Fe, Co, and Ni, and non-magnetic metal such as Ru, Pt, Rh, Pd, or Cr, and an amorphous alloy, such as TbFeCo or GdFeCo, which contains a transition metal in a rare-earth metal such as Gd, Dy, or Tb. Alternatively, a CoCr alloy or a CoCrPt alloy which contains Co and at least one of Cr, Ta, Nb, V, W, Hf, Ti, Zr, Pt, Pd, Fe, and Ni may also be used, for example. Further, different combinations of the materials may also be used for the first magnetic layer 21 and the second magnetic layer 22.

It is desirable to use Ru or Ta, which is used in Example 3, as the cap layer 14, in view of the reaction or diffusion with the magnetic layer by the anneal treatment. In this case, however, metal such as Pt, Cr, Ti, or W may also be used as other materials.

Example 4

Example 4 proposes an MTJ element which uses a synthetic ferri-magnetic structure in which each of a magnetic layer, an intermediate layer, a high polarizability magnetic layer and a high polarizability magnetic layer, an intermediate layer, and a magnetic layer, which are formed on the upper and lower sides of the barrier layer, has an antiferromagnetic coupling. The basic structure, material of each layer, and film thickness of the MTJ element of Example 4 are the same as those of the structure of Example 1 shown in FIG. 1, except for the first intermediate layer 31 and the second intermediate layer 32. In Example 4, Ru having a film thickness of 0.8 nm was used as each of the first intermediate layer 31 and the second intermediate layer 32. In the case of the structure of Example 4, the first magnetic layer 21 and the first high polarizability magnetic layer 41 are antiferromagnetically coupled and the second high polarizability magnetic layer 42 and the second magnetic layer 22 are antiferromagnetically coupled, which is advantageous in that a stray field generated therefrom can be suppressed.

Operation of the element of Example 4 will be described with dereference to FIGS. 6A to 6C. To facilitate the explanation, only the barrier layer 10, the first magnetic layer 21, the second magnetic layer 22, the first high polarizability magnetic layer 41, the second high polarizability magnetic layer 42, the first intermediate layer 31, and the second intermediate layer 32, which are associated with a change in resistance of the element, were illustrated. When a current is caused to flow perpendicularly to the film surface of the element, the magnetization of the second magnetic layer 22, which has a smaller thickness than the first magnetic layer 21, is reversed first. Accordingly, the laminated magnetic layer (second high polarizability magnetic layer 42/second intermediate layer 32/second magnetic layer 22) formed on the upper side of the barrier layer 10 serves as a recording layer, and the laminated magnetic layer (first magnetic layer 21/first intermediate layer 31/first high polarizability magnetic layer 41) formed on the lower side serves as a pinned layer.

Figure 6A:
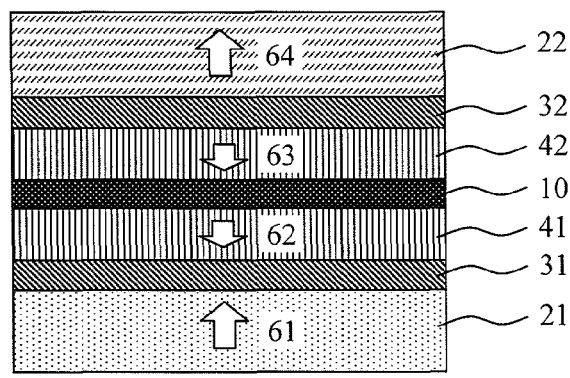
FIG. 6A is a diagram schematically showing a magnetization reversal operation of the MTJ element of Example 4.

FIG. 6A shows an initial state in which no current flows through the element. The magnetization 61 of the first magnetic layer 21 and the magnetization 64 of the second magnetic layer 22 face upward. The first high polarizability magnetic layer 41 and the second high polarizability magnetic layer 42 are antiferromagnetically coupled with the first magnetic layer 21 and the second magnetic layer 22 through the first intermediate layer 31 and the second intermediate layer 32, respectively. CoFeB used as the material of each of the high polarizability magnetic layers 41 and 42 is originally an in-plane magnetized material, but the magnetization of CoFeB faces in the perpendicular direction when CoFeB is magnetically coupled with the perpendicularly magnetized magnetic layers 21 and 22. To antiferromagnetically couple the first magnetic layer 21 showing a perpendicular magnetization, the magnetization 62 of the first high polarizability magnetic layer 41 faces downward and the magnetization 63 of the second high polarizability magnetic layer 42 that is antiferromagnetically coupled with the second magnetic layer 22 also faces downward.

Figure 6B:
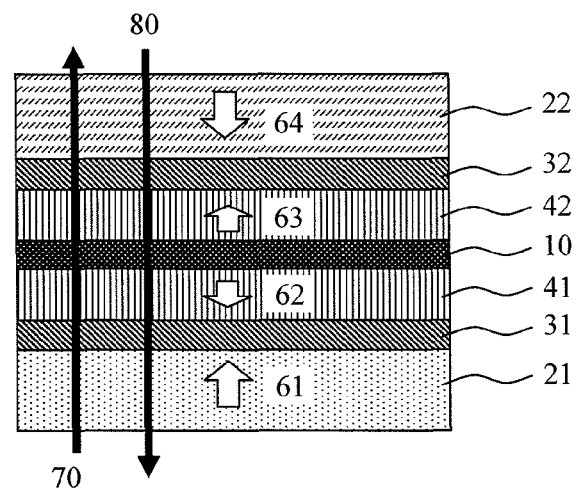
FIG. 6B is a diagram schematically showing a magnetization reversal operation of the MTJ element of Example 4.

FIG. 6B shows a direction of magnetization obtained when a current is caused to flow to the element from the state of FIG. 6A. When the current 70 is caused to flow from the lower portion to the upper portion of the element, the spin-polarized electron 80 passes through the second high polarizability magnetic layer 42 and flows to the first high polarizability magnetic layer 41. In this case, only electrons having a spin in the same direction as the spin of the second high polarizability magnetic layer 42 flow into the first high polarizability magnetic layer 41, and electrons having a spin in the opposite direction is reflected by the surface of the barrier layer 10. The reflected electrons act on the magnetization 63 of the second high polarizability magnetic layer 42 of the recording layer, and the magnetization 63 of the second high polarizability magnetic layer 42 is reversed by spin injection magnetization reversal. At the same time, the magnetization 64 of the second magnetic layer 22 which is antiferromagnetically coupled in a synthetic ferri-magnetic structure is also reversed. At this time, the magnetization 62 of the first high polarizability magnetic layer 41 of the pinned layer, and the magnetization 63 of the second high polarizability magnetic layer 42 of the recording layer are aligned in antiparallel with each other, and the MTJ element is switched from the low-resistance state to the high-resistance state.

Figure 6C:
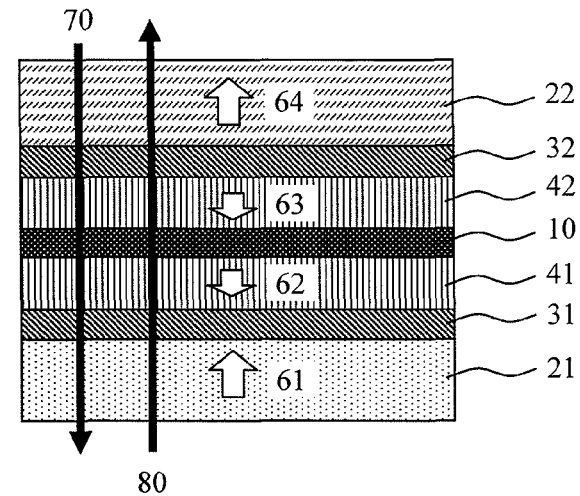
FIG. 6C is a diagram schematically showing a magnetization reversal operation of the MTJ element of Example 4.

On the other hand, when a current is caused to flow from the upper portion to the lower portion of the element, the state of FIG. 6B shifts to a state shown in FIG. 6C. When the current 70 is caused to flow from the upper portion to the lower portion of the element, the spin-polarized electron 80 flows from the first high polarizability magnetic layer 41 into the second high polarizability magnetic layer 42, and the magnetization 63 of the second high polarizability magnetic layer 42 is reversed by spin injection magnetization reversal. At the same time, the magnetization 64 of the second magnetic layer 22 which is antiferromagnetically coupled in a synthetic ferri-magnetic structure is also reversed. At this time, the magnetization 62 of the first high polarizability magnetic layer 41 of the pinned layer and the magnetization 63 of the second high polarizability magnetic layer 42 of the recording layer are aligned in parallel with each other, and the resistance of the MTJ element switches from the high-resistance state to the low-resistance state.

As described above, in the MTJ element of Example 4, the resistance change characteristic due to the current are similar to that of Example, though the high polarizability magnetic layer 41 (42) and the magnetic layer 21 (22) are operated by being coupled in antiparallel through the intermediate layer. The change in TMR ratio by annealing is also similar to that of Example 1. The effect of improving the heat resistance of the TMR ratio as compared with the conventional MTJ element in which no intermediate layer is inserted between the high polarizability magnetic layer and the magnetic layer was confirmed.

Though Ru was used for each of the first intermediate layer 31 and the second intermediate layer 32 in Example 4, the same effect as that of Example 4 can be obtained also by using material having a melting point of 1600° C. or higher, such as W, Ta, Pt, Ti, Os, V, Cr, Nb, Mo, Rh, Hf, or Re. Further, different combinations of the materials may also be used for the first intermediate layer 31 and the second intermediate layer 32.

Though a laminated film of CoFe and Pd was applied as the perpendicularly magnetized material of each of the first magnetic layer 21 and the second magnetic layer 22 in Example 4, the same effect as that of Example 4 can be obtained also by applying the other perpendicularly magnetized material. Examples of specific materials to be used may include an $L1_0$ type ordered alloy, such as $Co_{50}Pt_{50}$, $Pe_{50}Pt_{50}$, or $Fe_{30}Ni_{20}Pt_{50}$, m-$D0_{19}$ type $Co_{75}Pt_{25}$ ordered alloy, material having a granular structure in which granular magnetic material such as $CoCrPt-SiO_2$ or $FePt-SiO_2$ is dispersed in a parent phase of non-magnetic material, a laminated film formed by alternately laminating any one of Fe, Co, and Ni or an alloy containing at least one of Fe, Co, and Ni, and non-magnetic metal such as Ru, Pt, Rh, Pd, or Cr, and an amorphous alloy, such as TbFeCo or GdFeCo, which contains a transition metal in a rare-earth metal such as Gd, Dy, or Tb. Alternatively, a CoCr alloy or a CoCrPt alloy which contains Co and at least one of Cr, Ta, Nb, V, W, Hf, Ti, Zr, Pt, Pd, Fe, and Ni may also be used, for example. Further, different combinations of the materials may also be used for the first magnetic layer 21 and the second magnetic layer 22.

It is desirable to use Ru or Ta, which is used in Example 4, as the cap layer 14, in view of the reaction or diffusion with the magnetic layer by the anneal treatment. In this case, however, metal such as Pt, Cr, Ti, or W may also be used as other materials.

Example 5

In Example 5 proposes an MTJ element which uses a ferromagnetic material of an amorphous alloy as the material of the intermediate layer. The structure is similar to that of the MTJ element of Example 1 shown in FIG. 1, except that an amorphous alloy of FeTaN is used for the first intermediate layer 31 and the second intermediate layer 32. Since FeTaN is a ferromagnetic material, the first magnetic layer 21, the first intermediate layer 31, and the first high polarizability magnetic layer 41 are magnetically coupled, and the magnetizations of the three layers face in the same direction. Thus, the operation of the element is similar to that of the MTJ element of Example 1. As a result of evaluating the characteristics of the produced MTJ element of Example 5 by the same method as that of Example 1, the same TMR ratio as that of Example 1 was obtained, and the effect of improving the heat resistance of the TMR ratio as compared with the conventional MTJ element in which no intermediate layer is inserted was confirmed.

The reason that a high TMR ratio can be obtained even after annealing at 250° C. is as follows. That is, FeTaN used for the first intermediate layer 31 and the second intermediate layer 32 contains Ta having a melting point higher than that of Co and Fe, and has a crystallization temperature higher than that of CoFeB used for the high polarizability magnetic layer. When CoFeB is crystallized by annealing, FeTaN contacting CoFeB is maintained in the amorphous state. Thus, boron contained in CoFeB is hardly diffused in FeTaN and CoFeB is crystallized in bcc (001) from the MgO side.

Though FeTaN was used for the first intermediate layer 31 and the second intermediate layer 32 in Example 5, the same effect as that of Example 5 can be obtained also by using an amorphous ferromagnetic material alloy, such as FeTaC, FeZrB, FeHfB, FeTaB, CoZrNb, CoFeBNb, CoFeZr, CoFeZrNb, CoFeZrTa, CoTaZr, FeSiBNb, FeSiBZr, FeSiBHf, FeSiBTa, CoSiBNb, CoSiBZr, CoSiBHf, or CoSiBTa, as other materials. Further, different combinations of the materials may also be used for the first intermediate layer 31 and the second intermediate layer 32.

Though a laminated film of CoFe and Pd was applied as the perpendicularly magnetized material of each of the first magnetic layer 21 and the second magnetic layer 22 in Example 5, the same effect as that of Example 5 can be obtained also by applying the other perpendicularly magnetized materials. Examples of specific materials to be used may include an $L1_0$ type ordered alloy, such as $Co_{50}Pt_{50}$, $Fe_{50}Pt_{50}$, or $Fe_{30}Ni_{20}Pt_{50}$, $m-D0_{19}$ type $Co_{75}Pt_{25}$ ordered alloy, material having a granular structure in which granular magnetic material such as $CoCrPt-SiO_2$ or $FePt-SiO_2$ is dispersed in a parent phase of non-magnetic material, a laminated film formed by alternately laminating any one of Fe, Co, and Ni or an alloy containing at least one of Fe, Co, and Ni, and non-magnetic metal such as Ru, Pt, Rh, Pd, or Cr, and an amorphous alloy, such as TbFeCo or GdFeCo, which contains a transition metal in a rare-earth metal such as Gd, Dy, or Tb. Alternatively, a CoCr alloy or a CoCrPt alloy which contains Co and at least one of Cr, Ta, Nb, V, W, Hf, Ti, Zr, Pt, Pd, Fe, and Ni may also be used, for example. Further, different combinations of the materials may also be used for the first magnetic layer 21 and the second magnetic layer 22.

It is desirable to use Ru or Ta, which is used in Example 5, as the cap layer 14, in view of the reaction or diffusion with the magnetic layer by the anneal treatment. In this case, however, metal such as Pt, Cr, Ti, or W may also be used as other materials.

Example 6

Figure 7:
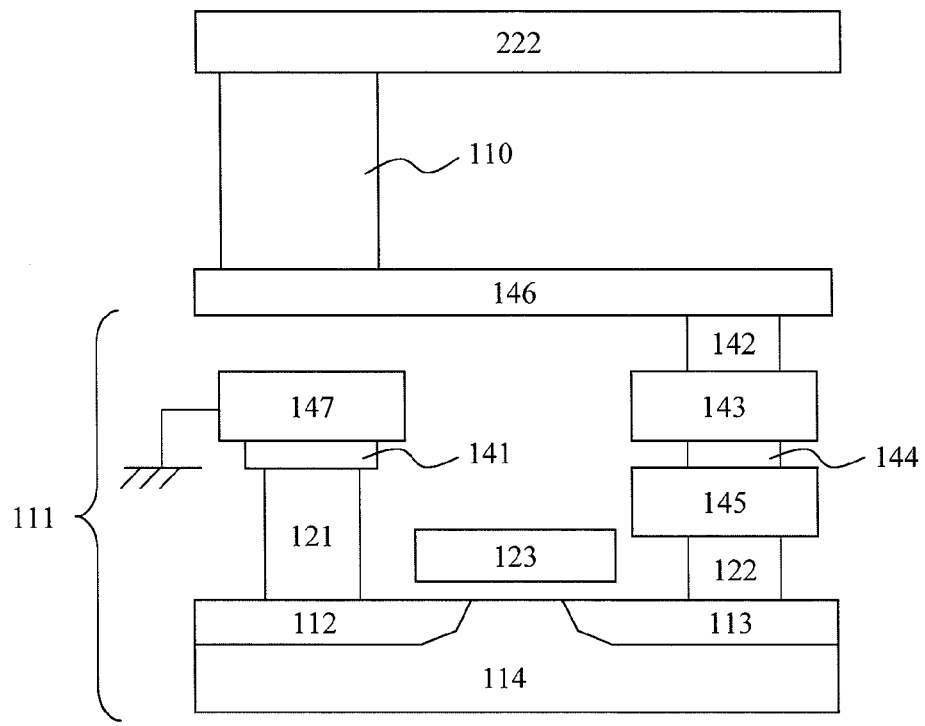
FIG. 7 is a cross-sectional schematic diagram showing a configuration example of a magnetic memory cell.

Example 6 proposes a random access memory to which the MTJ element of the present invention is applied. FIG. 7 is a cross-sectional schematic diagram showing a configuration example of a magnetic memory cell according to the present invention. This magnetic memory cell incorporates an MTJ element 110 illustrated in Examples 1 to 5.

A C-MOS 111 is composed of two n-type semiconductors 112 and 113 and a p-type semiconductor 114. The n-type semiconductor 112 is electrically connected with an electrode 121 serving as a drain and is connected to a ground through an electrode 141 and an electrode 147. The n-type semiconductor 113 is electrically connected with an electrode 122 serving as a source. Reference numeral 123 denotes a gate electrode, and this gate electrode 123 is turned on/off to thereby control ON/OFF of a current flowing between the source electrode 122 and the drain electrode 121. An electrode 145, an electrode 144, an electrode 143, an electrode 142, and an electrode 146 are laminated on the source electrode 122, and the lower electrode 11 of the MTJ element 110 through the electrode 146.

A bit line 222 is connected to the upper electrode 12 of the MTJ element 110. In the magnetic memory cell of this example, the magnetization direction of the recording layer of the MTJ element 110 is rotated by a current flowing through the MTJ element 110, that is, spin transfer torque, thereby recording magnetic information. The spin transfer torque is a principle in which not a spatial external magnetic field but a spin of a spin-polarized current flowing through the MTJ element mainly provides torque to a magnetic moment of a ferromagnetic recording layer of an MTJ element. Accordingly, means for supplying a current to the MTJ element from the outside and a current is caused to flow using the means, thereby achieving the spin transfer torque magnetization reversal. In this example, the magnetization direction of the recording layer in the MTJ element 110 is controlled by causing a current to flow between the bit line 222 and the electrode 146.

Figure 8:
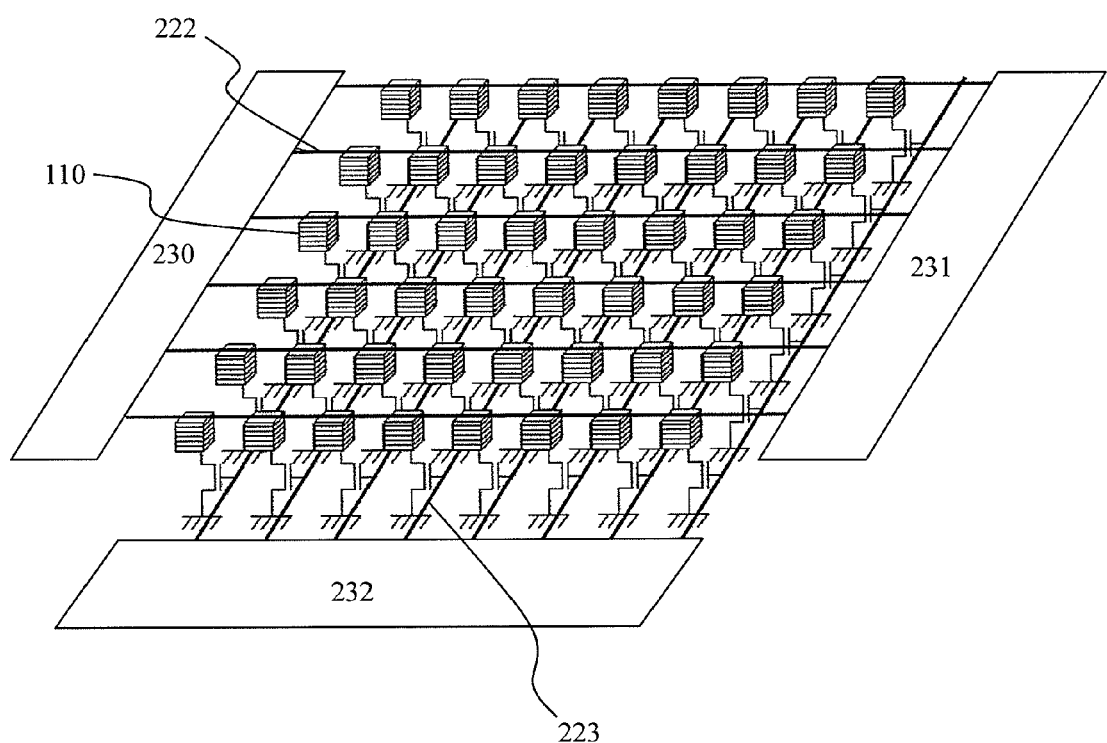
FIG. 8 is a schematic diagram showing a configuration example of a random access memory.

FIG. 8 is a diagram showing a configuration example of the magnetic random access memory in which the magnetic memory cells are arranged in an array. A word line 223 connected to the gate electrode 123, and the bit line 222 are electrically connected to the memory cell including the MTJ element 110. The magnetic memory cells including the MTJ elements illustrated in Examples 1 to 5 are arranged, thereby enabling the magnetic memory of the present invention to operate with lower consumption than the conventional case and achieving a gigabit-class high density magnetic memory.

In the case of writing with this structure, a write enable signal is first transmitted to a write driver connected to the bit line 222, through which a current is to be caused to flow, to boost the voltage, thereby causing a predetermined current to flow through the bit line 222. One of a write driver 230 and a write driver 231 is reduced in voltage to the ground depending on the direction of the current to adjust a potential difference, thereby controlling the current direction. Then, after a lapse of a predetermined period of time, the write enable signal is transmitted to the write driver 232 connected to the word line 223 to boost the voltage of the write driver 232, thereby turning on the transistor connected to the MTJ element to be written. Thus, a current flows through the MTJ element and the spin torque magnetization reversal is carried out. After the transistor is turned on for a predetermined period of time, the signal to the write driver 232 is disconnected to turn off the transistor. In the case of reading, only the bit line 222 connected to the MTJ element to be read is read to boost a voltage V, and only the selected transistor is turned on to cause a current to flow, thereby performing reading. This structure has a simplest layout in which one transistor + one memory cell are arranged. Consequently, an occupied area per cell has a high integration of $2F \times 4F = 8F^2$.

REFERENCE SIGNS LIST

5 Substrate
10 Barrier Layer
11 Lower Electrode
12 Upper Electrode
13 Foundation Layer
14 Cap Layer
21 First Magnetic Layer
22 Second Magnetic Layer
31 First Intermediate Layer
32 Second Intermediate Layer
41 First High Polarizability Magnetic Layer
42 Second High Polarizability Magnetic Layer
43 Third High Polarizability Magnetic Layer
61, 62, 63, 64 Magnetization
70 Current
80 Electron
110 MTJ Element
111 C-MOS
112, 113 N-Type Semiconductor
114 P-Type Semiconductor
121 Source Electrode
122 Drain Electrode
123 Gate Electrode
141, 142, 143, 144, 145, 146, 147 Electrode 222 Bit Line
223 Word Line
230, 231, 232 Write Driver

The invention claimed is:

1. A tunneling magnetoresistive effect element comprising:
a recording layer formed of a ferromagnetic thin film having a perpendicular magnetic anisotropy;
a pinned layer having a perpendicular magnetic anisotropy and formed of a ferromagnetic thin film having a magnetization direction fixed in one direction;
an MgO (001) crystal barrier layer disposed between the recording layer and the pinned layer;
a first CoFeB bcc (001) oriented layer disposed at a substrate-side interface of the barrier layer;
a second CoFeB bcc (001) oriented layer disposed at an interface of the barrier layer on an opposite side to the substrate;
a first intermediate layer disposed at an interface of the first CoFeB layer on an opposite side to the barrier layer, and
a second intermediate layer disposed at an interface of the second CoFeB layer on an opposite side to the barrier layer,
wherein the first and second intermediate layers comprise one of, or an alloy comprising one of, Pt, Os, V, Cr, Rh, and Re.

2. The tunneling magnetoresistive effect element according to claim 1, wherein both or one of the recording layer and the pinned layer is any one of Co, Fe, and Ni, or an ordered alloy containing at least one of Co, Fe, and Ni and at least one of Pt and Pd.

3. The tunneling magnetoresistive effect element according to claim 1, wherein both or one of the recording layer and the pinned layer is an alloy containing Co and at least one of Cr, Ta, Nb, V, W, Hf, Ti, Zr, Pt, Pd, Fe, and Ni.

4. The tunneling magnetoresistive effect element according to claim 1, wherein both or one of the recording layer and the pinned layer is a laminated film having a structure in which any one of Fe, Co, and Ni or an alloy containing at least one of Fe, Co, and Ni, and a non-magnetic metal are alternately laminated.

5. The tunneling magnetoresistive effect element according to claim 1, wherein both or one of the recording layer and the pinned layer has a granular structure in which a non-magnetic material surrounds a granular magnetic material.

6. The tunneling magnetoresistive effect element according to claim 1, wherein both or one of the recording layer and the pinned layer is an amorphous alloy containing a rare-earth metal and a transition metal.

7. A magnetic memory cell comprising:
a tunneling magnetoresistive effect element including a recording layer and a pinned layer;
an electrode for allowing a current to flow through the tunneling magnetoresistive effect element; and
a switching element that controls on/off of the current flowing through the tunneling magnetoresistive effect element,
magnetization of the recording layer being allowed to be reversed by a spin transfer torque,
wherein the tunneling magnetoresistive effect element comprises: the recording layer formed of a ferromagnetic thin film having a perpendicular magnetic anisotropy; the pinned layer having a perpendicular magnetic anisotropy and formed of a ferromagnetic thin film having a magnetization direction fixed in one direction; an MgO (001) crystal barrier layer disposed between the recording layer and the pinned layer; a first CoFeB bcc (001) oriented layer disposed at a substrate-side interface of the barrier layer; a second CoFeB bcc (001) oriented layer disposed at an interface of the barrier layer on an opposite side to the substrate; a first intermediate layer disposed at an interface of the first CoFeB layer on an opposite side to the barrier layer; and a second intermediate layer disposed at an interface of the second CoFeB layer on an opposite side to the barrier layer, the first and second intermediate layers comprising one of, or an alloy comprising one of, Pt, Os, V, Cr, Rh, and Re.

8. A random access memory comprising:
a plurality of magnetic memory cells;
a selector configured to select a desired magnetic memory cell from among the plurality of magnetic memory cells; and
a unit configured to read or write information from or to the selected magnetic memory cell, wherein
the magnetic memory cells comprise: a tunneling magnetoresistive effect element including a recording layer and a pinned layer; an electrode for allowing a current to flow through the tunneling magnetoresistive effect element; and a switching element for controlling on/off of a current flowing through the tunneling magnetoresistive effect element,
the tunneling magnetoresistive effect element comprises: the recording layer formed of a ferromagnetic thin film having a perpendicular magnetic anisotropy; the pinned layer having a perpendicular magnetic anisotropy and formed of a ferromagnetic thin film having a magnetization direction fixed in one direction; an MgO (001) crystal barrier layer disposed between the recording layer and the pinned layer; a first CoFeB bcc (001) oriented layer disposed at a substrate-side interface of the barrier layer; a second CoFeB bcc (001) oriented layer disposed at an interface of the barrier layer on an opposite side to the substrate; a first intermediate layer disposed at an interface of the first CoFeB layer on an opposite side to the barrier layer; and a second intermediate layer disposed at an interface of the second CoFeB layer on an opposite side to the barrier layer, the first and second intermediate layers comprising one of, or an alloy comprising one of, Pt, Os, V, Cr, Rh, and Re, and
said unit is configured to allow magnetization of the recording layer of the magnetic memory cell selected for writing to be reversed by a spin transfer torque.

* * * * *